United States Patent
Ito et al.

(10) Patent No.: US 9,384,965 B2
(45) Date of Patent: Jul. 5, 2016

(54) POLYCRYSTALLIZATION METHOD

(71) Applicant: Japan Display Inc., Minato-ku (JP)

(72) Inventors: Naoya Ito, Minato-ku (JP); Toshihide Jinnai, Minato-ku (JP); Hirofumi Mizukoshi, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 14/540,458

(22) Filed: Nov. 13, 2014

(65) Prior Publication Data
US 2015/0140794 A1  May 21, 2015

(30) Foreign Application Priority Data
Nov. 19, 2013  (JP) .................................. 2013-239048

(51) Int. Cl.
*H01L 21/20* (2006.01)
*H01L 21/02* (2006.01)
*H01L 27/12* (2006.01)

(52) U.S. Cl.
CPC .... *H01L 21/02238* (2013.01); *H01L 21/02052* (2013.01); *H01L 21/02323* (2013.01); *H01L 21/02343* (2013.01); *H01L 21/02422* (2013.01); *H01L 21/02532* (2013.01); *H01L 21/02686* (2013.01); *H01L 21/02691* (2013.01); *H01L 21/02667* (2013.01); *H01L 27/1274* (2013.01)

(58) Field of Classification Search
CPC ................... H01L 21/02052; H01L 29/66757; H01L 29/78675; H01L 21/02667; H01L 21/02669; H01L 21/02672; H01L 21/02238; H01L 27/1274

USPC ................ 257/49, 72, 149, 296, 411, E21.09, 257/E29.003; 438/166, 336, 401, 795, 97, 438/487, 488
See application file for complete search history.

(56) References Cited

U.S. PATENT DOCUMENTS

| | | | | |
|---|---|---|---|---|
| 2002/0034845 A1* | 3/2002 | Fujimura | ............ | H01L 21/2026 438/166 |
| 2002/0052096 A1* | 5/2002 | Zhang | ................ | H01L 21/02052 438/487 |
| 2009/0098710 A1* | 4/2009 | Yamazaki | ............. | H01L 21/268 438/458 |

FOREIGN PATENT DOCUMENTS

| | | |
|---|---|---|
| JP | 10 92745 | 4/1998 |
| JP | 11 354801 | 12/1999 |
| JP | 2002 124467 A | 4/2002 |
| JP | 2010 34463 | 2/2010 |

* cited by examiner

*Primary Examiner* — Kimberly Rizkallah
*Assistant Examiner* — Maria Ligai
(74) *Attorney, Agent, or Firm* — Oblon, McClelland, Maier & Neustadt, L.L.P.

(57) ABSTRACT

According to one embodiment, provided is a polycrystallization method for polycrystallizing an amorphous semiconductor film that has a natural oxide film on the surface. The polycrystallization method includes a step of cleaning the natural oxide film while leaving the natural oxide film on the surface of the amorphous semiconductor film, and a step of polycrystallizing the amorphous semiconductor film in the state where the natural oxide film is left.

15 Claims, 1 Drawing Sheet

POLYCRYSTALLIZATION METHOD

INCORPORATION BY REFERENCE

The present invention claims priority under 35 U.S.C. §119 to Japanese Patent Application No. 2013-239048 filed on Nov. 19, 2013. The content of the application is incorporated herein by reference in its entirety.

FIELD

An embodiment of the present invention relates to a polycrystallization method for polycrystallizing an amorphous semiconductor film.

BACKGROUND

Conventionally, as a switching element of a display element, a thin film transistor using a polycrystalline semiconductor film as a semiconductor layer is used.

To manufacture a polycrystalline semiconductor film, a method for polycrystallizing an amorphous semiconductor film by irradiating a laser beam thereon is used. In this method, by forming an oxide film on the surface of the amorphous semiconductor film, it becomes possible to form a polycrystalline semiconductor film by utilizing oxygen contained in the oxide film. On the surface of the amorphous semiconductor film, a natural oxide film is formed through heat treatment and preservation in the atmosphere, etc., of the amorphous semiconductor film, however, this natural oxide film is not stable, so that if the natural oxide film is utilized for polycrystallization of the amorphous semiconductor film, the characteristics of the thin film transistor do not become stable.

Therefore, in order to polycrystallize an amorphous semiconductor film, in the pretreatment process, the natural oxide film on the surface of the amorphous semiconductor film is completely removed with hydrofluoric acid. Thereafter, in the crystallization process, first, the amorphous semiconductor film is irradiated with a laser in the atmosphere of oxygen at a comparatively high concentration, and the surface of the amorphous semiconductor film is oxidized again to form a surface oxide film, and subsequently, the oxygen concentration in the atmosphere is lowered, and by utilizing oxygen introduced into the surface oxide film, the amorphous semiconductor film is polycrystallized.

Thus, for polycrystallization of an amorphous semiconductor film, it is necessary that the surface of the amorphous semiconductor film is oxidized again in the crystallization process to form a surface oxide film after the natural oxide film is completely removed in the pretreatment process, so that there are problems that the number of processes is large and the production efficiency is low.

DETAILED DESCRIPTION

An embodiment is a polycrystallization method for polycrystallizing an amorphous semiconductor film that has a natural oxide film on the surface. The polycrystallization method includes a step of cleaning the natural oxide film while leaving the natural oxide film on the surface of the amorphous semiconductor film, and a step of polycrystallizing the amorphous semiconductor film in the state where the natural oxide film is left.

Hereinafter, an embodiment is described with reference to FIGS. 1A-1C and FIG. 2.

Figure 1A:
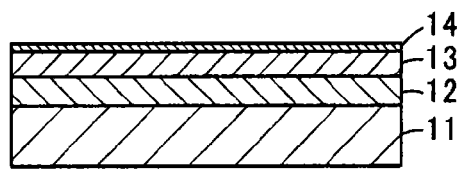
FIGS. 1A-1C are sectional views showing processes of a polycrystallization method showing an embodiment in FIGS. 1A-1C.
Figure 1B:
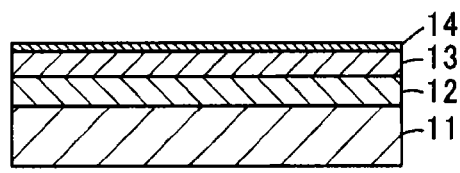
Figure 1C:
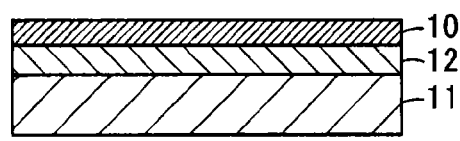

FIGS. 1A-1C show processes for forming a polycrystalline semiconductor film 10 as, for example, a semiconductor layer in a gate-top type thin film transistor. The polycrystalline semiconductor film 10 is, for example, a polysilicon film.

FIG. 1A shows a state before the polycrystalline semiconductor film 10 is manufactured. On a substrate 11 such as a glass substrate, an undercoat film 12 is formed by a plasma CVD method, etc. On the surface of this undercoat film 12, an amorphous semiconductor film 13 is formed by a plasma CVD method, etc. The amorphous semiconductor film 13 is, for example, an amorphous silicon film.

On the surface of the amorphous semiconductor film 13, due to heat treatment for removing hydrogen contained in the amorphous semiconductor film 13 and preservation in the atmosphere, etc., a natural oxide film 14 is formed by natural oxidation.

Next, a method for manufacturing the polycrystalline semiconductor film 10 is described. The manufacturing process includes a pretreatment process and a crystallization process.

First, the pretreatment process is described. As shown in FIG. 1B, while the natural oxide film 14 on the surface of the amorphous semiconductor film 13 is left, the natural oxide film 14 is cleaned.

For this cleaning, oxidation treatment is performed to oxidize the natural oxide film 14. In this oxidation treatment, a liquid such as pure water (hereinafter, referred to as ozone water) in which ozone is dissolved is used, and this ozone water is brought into contact with the natural oxide film 14 by spraying or the like. The allowable concentration of the ozone to be dissolved in the liquid is in a range from 1 ppm to 100 ppm, and preferably, from 5 ppm to 10 ppm.

Through this oxidation treatment, by utilizing the oxidizing power of the ozone water, the surface of the natural oxide film 14 is washed, and by further oxidizing the natural oxide film 14, a predetermined amount of oxygen is uniformly introduced into the natural oxide film 14. Therefore, cleaning of the natural oxide film 14 includes washing of the surface of the natural oxide film 14 and further oxidation of the natural oxide film 14 for uniformly introducing the predetermined amount of oxygen into the natural oxide film 14.

This oxidation treatment is performed until the surface of the natural oxide film 14 acquires sufficient hydrophilic property. Specifically, the oxidation treatment is performed until the contact angle of a water droplet with respect to the surface of the natural oxide film 14 in the state where the water droplet is dripped on the natural oxide film 14 becomes 15 degrees or less.

Next, the crystallization treatment is described. As shown in FIG. 1C, by polycrystallizing the amorphous semiconductor film 13 in the state where the natural oxide film 14 is left, the polycrystalline semiconductor film 10 is formed. In this crystallization process, excimer laser annealing treatment is performed.

Figure 2:
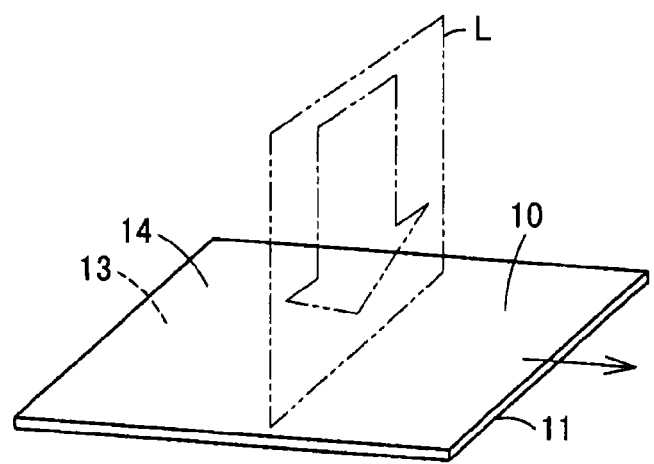
FIG. 2 is a perspective view of a crystallization process according to the polycrystallization method.

In the excimer laser annealing treatment, as shown in FIG. 2, while a pulsed laser L is irradiated along the width direction of the substrate 11, the substrate 11 is fed in a direction orthogonal to the width direction so that the laser L is irradiated onto the entirety of the natural oxide film 14 and the amorphous semiconductor film 13. At this time, the atmospheric oxygen concentration is 500 ppm or less and the feeding speed of the substrate 11 is 20 μm/pulse. And, through the excimer laser annealing treatment, oxygen contained in the natural oxide film 14 is utilized to grow the polycrystalline semiconductor film, and accordingly, the polycrystalline semiconductor film 10 is formed.

As described above, according to the polycrystallization method, the natural oxide film 14 is cleaned while the natural oxide film 14 on the surface of the amorphous semiconductor film 13 is left, so that the removal treatment for completely removing the natural oxide film with hydrofluoric acid in the pretreatment process and the treatment for forming the surface oxide film by oxidizing again the surface of the amorphous semiconductor film in the crystallization process performed in the conventional method become unnecessary, and therefore, the number of processes can be reduced and the production efficiency can be improved.

In the cleaning step, oxidation treatment is performed, so that the predetermined amount of oxygen can be uniformly introduced into the natural oxide film 14, and a stable polycrystalline semiconductor film 10 can be formed in the polycrystallizing step.

Further, ozone water is used for oxidation treatment, so that washing of the surface of the natural oxide film 14 and further oxidation of the natural oxide film 14 for uniformly introducing the predetermined amount of oxygen into the natural oxide film 14 can be simultaneously performed.

Further, the concentration of the ozone to be dissolved in the liquid is in a range from 1 ppm to 100 ppm, so that proper oxidation treatment can be performed. Preferably, by limiting the concentration to a range from 5 ppm to 10 ppm, better oxidation treatment can be performed.

The oxidation treatment is performed until the contact angle of a water droplet with respect to the surface of the natural oxide film 14 in the state where the water droplet is dripped on the natural oxide film 14 becomes 15 degrees or less, so that the surface of the natural oxide film 14 can be uniformized and a stable polycrystalline semiconductor film 10 can be formed in the polycrystallizing step.

In the crystallization process, excimer laser annealing treatment is performed, and at this time, the amorphous semiconductor film 13 can be polycrystallized by utilizing oxygen contained in the natural oxide film 14.

By using a thin film transistor manufactured as described above, an active matrix substrate can be constituted. The active matrix substrate includes a substrate, switching elements being thin film transistors formed on the substrate, signal wiring that supplies electric signals to the switching elements, and pixel electrodes that are electrically connected to the switching elements and formed on the substrate.

This active matrix substrate can be used in display elements such as liquid crystal display elements, organic EL display elements, and other spontaneous light emitting display elements, etc.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A polycrystallization method for polycrystallizing an amorphous semiconductor film that has a natural oxide film on the surface, comprising:
    cleaning the natural oxide film while leaving the natural oxide film on the surface of the amorphous semiconductor film; and
    polycrystallizing the amorphous semiconductor film in the state where the natural oxide film is left by excimer laser annealing treatment in which the atmospheric oxygen concentration is 500 ppm or less.

2. The polycrystallization method according to claim 1, wherein the cleaning of the natural oxide film while leaving the natural oxide film on the surface of the amorphous semiconductor film is accomplished by oxidation treatment.

3. The polycrystallization method according to claim 2, wherein the oxidation treatment uses a liquid in which ozone is dissolved.

4. The polycrystallization method according to claim 3, wherein the concentration of the ozone to be dissolved in the liquid is in a range from 1 ppm to 100 ppm.

5. The polycrystallization method according to claim 2, wherein in the oxidation treatment, a contact angle of a water droplet on the natural oxide film is 15 degrees or less.

6. The polycrystallization method according to claim 2, wherein in the oxidation treatment, a predetermined amount of oxygen is uniformly introduced into the natural oxide film.

7. The polycrystallization method according to claim 1, wherein in the excimer laser annealing treatment, oxygen contained in the natural oxide film is utilized to grow a polycrystalline semiconductor film, and accordingly, a polycrystalline semiconductor film is formed.

8. The polycrystallization method according to claim 7, wherein the polycrystalline semiconductor film is a polysilicon film.

9. The polycrystallization method according to claim 1, wherein the amorphous semiconductor film is an amorphous silicon film.

10. A polycrystallization method for polycrystallizing an amorphous semiconductor film that has a natural oxide film on the surface, comprising:
    cleaning the natural oxide film while leaving the natural oxide film on the surface of the amorphous semiconductor film by oxidation treatment; and
    polycrystallizing the amorphous semiconductor film in the state where the natural oxide film is left,
    wherein in the oxidation treatment a contact angle of a water droplet on the natural oxide film is 15 degrees or less.

11. The polycrystallization method according to claim 10, wherein the oxidation treatment uses a liquid in which ozone is dissolved.

12. The polycrystallization method according to claim 11, wherein the concentration of the ozone to be dissolved in the liquid is in a range from 1 ppm to 100 ppm.

13. The polycrystallization method according to claim 11, wherein the concentration of the ozone to be dissolved in the liquid is in a range from 5 ppm to 10 ppm.

14. The polycrystallization method according to claim 10, wherein the amorphous semiconductor film is an amorphous silicon film.

15. The polycrystallization method according to claim 10, wherein the amorphous semiconductor film is polycrystallized in the state where the natural oxide film is left by excimer laser annealing treatment.

* * * * *